US011348769B2

(12) United States Patent
Hawrylchak et al.

(10) Patent No.: US 11,348,769 B2
(45) Date of Patent: *May 31, 2022

(54) PLASMA-ENHANCED ANNEAL CHAMBER FOR WAFER OUTGASSING

(71) Applicant: Applied Materials, Inc., Santa Clara, CA (US)

(72) Inventors: Lara Hawrylchak, Gilroy, CA (US); Matthew D. Scotney-Castle, Morgan Hill, CA (US); Norman L. Tam, Cupertino, CA (US); Matthew Spuller, Belmont, CA (US); Kong Lung Samuel Chan, Newark, CA (US); Dongming Iu, Union City, CA (US); Stephen Moffatt, St. Brelade (JE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/014,736

(22) Filed: Sep. 8, 2020

(65) Prior Publication Data

US 2020/0402780 A1 Dec. 24, 2020

Related U.S. Application Data

(63) Continuation of application No. 15/480,187, filed on Apr. 5, 2017, now Pat. No. 10,770,272.

(Continued)

(51) Int. Cl.
*H01J 37/32* (2006.01)

(52) U.S. Cl.
CPC .. *H01J 37/32862* (2013.01); *H01J 37/32357* (2013.01); *H01J 37/32449* (2013.01);
(Continued)

(58) Field of Classification Search
None
See application file for complete search history.

(56) References Cited

U.S. PATENT DOCUMENTS 5,167,173 A   12/1992  Pietras
5,826,607 A * 10/1998  Knutson ............. C23C 16/4412
                                                      137/1
(Continued)

FOREIGN PATENT DOCUMENTS

CN       1822315 A    8/2006
CN     102414799 A    4/2012
(Continued)

OTHER PUBLICATIONS

Chinese Office Action dated Jul. 5, 2021, for Chinese Patent Application No. 201780024464.8.

(Continued)

*Primary Examiner* — Jethro M. Pence
(74) *Attorney, Agent, or Firm* — Patterson + Sheridan, LLP

(57) ABSTRACT

Implementations described herein provide for thermal substrate processing apparatus including two thermal process chambers, each defining a process volume, and a substrate support disposed within each process volume. One or more remote plasma sources may be in fluid communication with the process volumes and the remote plasma sources may be configured to deliver a plasma to the process volumes. Various arrangements of remote plasma sources and chambers are described.

12 Claims, 7 Drawing Sheets

Related U.S. Application Data

(60) Provisional application No. 62/320,932, filed on Apr. 11, 2016.

(52) U.S. Cl.
CPC .. *H01J 37/32458* (2013.01); *H01J 37/32834* (2013.01); *H01J 37/32899* (2013.01)

(56) References Cited

U.S. PATENT DOCUMENTS

| | | | |
|---|---|---|---|
| 6,082,225 | A | 7/2000 | Richardson |
| 6,776,070 | B1 | 8/2004 | Mason et al. |
| 6,835,278 | B2 | 12/2004 | Selbrede et al. |
| 7,655,092 | B2 | 2/2010 | Fairbairn et al. |
| 8,109,179 | B2 | 2/2012 | Richardson |
| 9,366,097 | B2 | 6/2016 | Hu et al. |
| 9,453,377 | B2 | 9/2016 | Mosing et al. |
| 2002/0036065 | A1 | 3/2002 | Yamagishi et al. |
| 2003/0007910 | A1* | 1/2003 | Diamant Lazarovich ............ B01D 53/326 422/186.18 |
| 2003/0129106 | A1 | 7/2003 | Sorensen et al. |
| 2006/0266288 | A1 | 11/2006 | Choi |
| 2007/0074606 | A1 | 4/2007 | Haise |
| 2010/0012273 | A1 | 1/2010 | Sankarakrishnan et al. |
| 2011/0265951 | A1 | 11/2011 | Xu et al. |
| 2012/0046774 | A1 | 2/2012 | Nakamura et al. |
| 2012/0222813 | A1 | 9/2012 | Pal et al. |
| 2013/0333616 | A1 | 12/2013 | Klindworth et al. |
| 2016/0090651 | A1 | 3/2016 | Ashihara et al. |

FOREIGN PATENT DOCUMENTS

| | | |
|---|---|---|
| CN | 103632998 A | 3/2014 |
| JP | 3123797 B2 | 1/2001 |
| JP | 2002-141293 A | 5/2002 |
| JP | 2003-107203 A | 4/2003 |
| JP | 2004-131760 A | 4/2004 |
| JP | 2005-534174 A | 11/2005 |
| JP | 2006-183152 A | 7/2006 |
| JP | 2006253629 A | 9/2006 |
| JP | 2009-188198 A | 8/2009 |
| JP | 2013-530516 A | 7/2013 |
| JP | 5775633 B1 | 9/2015 |
| TW | 201201311 A | 1/2012 |
| TW | 201413030 A | 4/2014 |
| TW | 201506195 A | 2/2015 |
| TW | 201535567 A | 9/2015 |
| WO | 2004010482 A1 | 1/2004 |
| WO | 2011/137069 A2 | 11/2011 |

OTHER PUBLICATIONS

Taiwan Office Action dated Aug. 3, 2021 for Application No. 109139456.

Office Action for Japanese Application No. 2020-117373 dated Oct. 5, 2021.

International Search Report and Written Opinion for Application No. PCT/US2017/026796 dated Jul. 10, 2017.

Taiwan Office Action dated Mar. 12, 2019 for Application No. 106111855.

Taiwan Office Action dated Jul. 22, 2019 for Application No. 106111855.

Japanese Office Action dated Oct. 29, 2019 for Application No. 2018-553133.

Korean Office Action dated Jan. 16, 2020 for Application No. 10-2018-7032300.

Taiwan Office Action dated Apr. 16, 2020 for Application No. 106111855.

Taiwan Office Action dated Aug. 12, 2020 for Application No. 106111855.

Office Action and Search Report for Chinese Application No. 201780024464.8 dated Jan. 28, 2022, 17 pages.

* cited by examiner

PLASMA-ENHANCED ANNEAL CHAMBER FOR WAFER OUTGASSING

CROSS-REFERENCE TO RELATED APPLICATIONS

This application is a continuation of U.S. patent application Ser. No. 15/480,187, filed May 5, 2017, which claims benefit of U.S. Pat. Appl. No. 62/320,932 filed Apr. 11, 2016, which are incorporated herein by reference.

BACKGROUND

Field

Implementations of the present disclosure generally relate to semiconductor processing chambers. More specifically, implementations described herein relate to a plasma enhanced anneal chamber for substrate outgassing.

Description of the Related Art

Thermal processing of semiconductor substrates is commonly employed in semiconductor manufacturing for a variety of purposes. Different types of thermal processing include rapid thermal processing, laser processing, soak annealing, and the like. Temperatures employed during thermal processing may be configured to alter various properties of the substrates and materials disposed thereon. For example, dopant diffusion, crystallographic material modification, and surface modification are just some of the types of processing that may be achieved by thermal processing.

In certain thermal processes, materials may be outgassed from the substrates being thermally processed. The outgassed materials are generally exhausted from the process volume of a thermal process chamber, however, the outgassed materials may also be deposited on chamber walls and components disposed within the chamber. The deposited materials may generate particles within the chamber and redeposit on the substrates which may lead to failure of microelectronic devices ultimately formed on the substrate. Cleaning of the chambers often requires substantial downtime during preventative maintenance which reduces the efficiency of thermal processing.

Thus what is needed in the art are improved thermal process chambers.

SUMMARY

In one implementation, a substrate processing apparatus is provided. The apparatus includes a first thermal process chamber defining a first process volume. A first substrate support may be disposed within the first process volume, a first remote plasma source may be fluidly coupled to the first process volume, and a first gas source may be fluidly coupled to the first remote plasma source. The apparatus also includes a second thermal process chamber defining a second process volume. The second thermal process chamber shares a wall with the first thermal process chamber. A second substrate support may be disposed within the second process volume, a second remote plasma source may be fluidly coupled to the second process volume, and a second gas source may be fluidly coupled to the second remote plasma source. An exhaust may also be fluidly coupled to the first process volume and the second process volume.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

Figure 1:
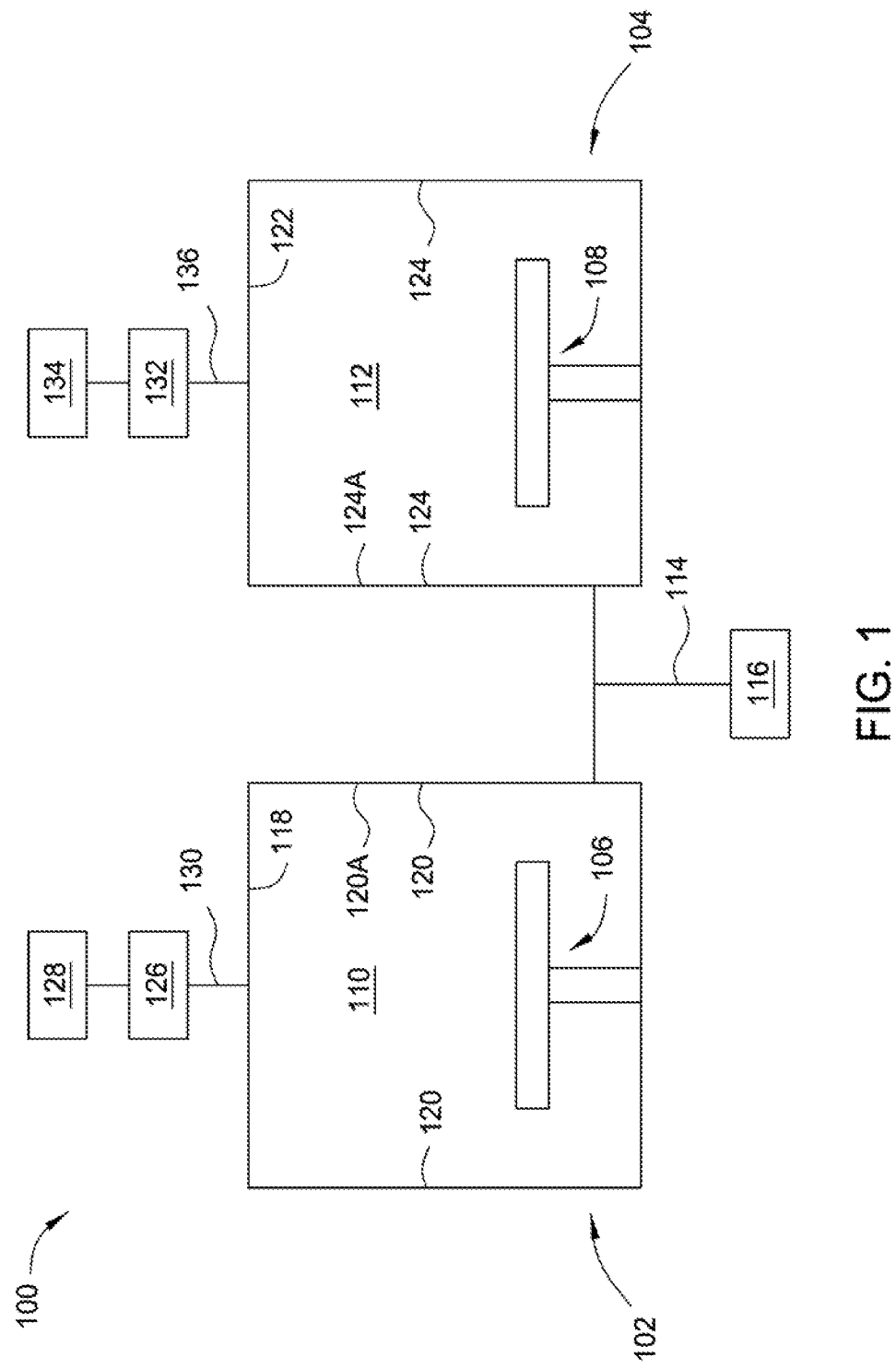
FIG. 1 schematically illustrates a dual chamber thermal processing apparatus having remote plasma sources according to one embodiment.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein provide for thermal substrate processing apparatus with in-situ cleaning capability. Apparatus described herein may include a thermal process chamber defining a process volume and a substrate support may be disposed within the process volume. One or more remote plasma sources may be in fluid communication with the process volume and the remote plasma sources may be configured to deliver a cleaning plasma to the process volume.

FIG. 1 schematically illustrates a dual chamber thermal processing apparatus 100 having remote plasma sources 126, 132 according to one implementation described herein. The apparatus 100 includes a first thermal processing chamber 102 which defines a first process volume 110. Walls of the first chamber 102, such as first sidewalls 120 and a first ceiling 118, further define the first process volume 110. The walls 120 and ceiling 118 may be formed from a material suitable to withstand elevated processing temperatures. For example, the first chamber 102 may be formed form stainless steel, aluminum, or another suitable metallic material. Surfaces of the first chamber 102 which define the process volume 110 may be coated with various materials to either enhance or prevent deposition thereon in certain implementations. Although not illustrated, it is also contemplated that various process kits, shields and the like may be disposed within the first process volume 110 to further improve particle management and thermal processing of substrates.

The first process volume 110 may be configured to perform thermal processing on a substrate disposed therein by heating the substrate to temperatures above about 400° C., such as between about 700° C. and about 1200° C., for example, between about 850° C. and about 1100° C. A first substrate support 106 is disposed within the first process volume 110. The first substrate support 106 may be configured to retain a substrate thereon during thermal processing by various methods, such as vacuum chucking or electrostatic chucking. It is also contemplated that a substrate may be positioned and/or retained on the first substrate support 106 by various other apparatus, such as rings or pins and the like. The first substrate support 106 may also include resistive heating apparatus, such as a coil or the like, to facilitate heating of substrates disposed thereon. Other heating methods, such as electromagnetic energy from lamps, may be used in combination with the resistive heating apparatus to heat the substrate.

A first remote plasma source 126 may be coupled to and in fluid communication with the first process volume 110. The first remote plasma source 126 may be configured to generate a plasma remotely from the first process volume 110 and deliver plasma products to the first process volume 110. Although not illustrated, the first remote plasma source 126 may be coupled to an RF power source. It is contemplated that the first remote plasma source 126 may be a capacitively coupled plasma generator or an inductively coupled plasma generator, depending upon desired plasma characteristics and chamber architecture. Various other plasma generation apparatus, such as RF chokes or grounding apparatus and the like, are not illustrated so as to not obscure the illustrated implementations.

The plasma products may be delivered to the first process volume 110 via a first conduit 130 which is fluidly coupled the first remote plasma source 126 and the first process volume 110. In one implementation, the first conduit 130 may extend from the first remote plasma source 126 to the first ceiling 118 of the first chamber 102. The first conduit 130 may be a conduit of any suitable shape and may be formed from a material which is predominantly inert to the plasma products generated by the first remote plasma source 126. In one implementation, the first conduit 130 may be formed from a quartz material, a ceramic material, or a metallic material. Surfaces of the first conduit 130 exposed to the plasma products may also be coated with various materials inert or substantially inert to the plasma products to reduce or prevent damage, etching, or deposition of the first conduit 130.

The first remote plasma source 126 may also be in fluid communication with a first gas source 128. The first gas source 128 delivers one or more precursor gases to the first remote plasma source 126. The first gas source 128 may deliver precursor gases such as argon, oxygen, nitrogen, helium, and fluorine containing gases, such as nitrogen trifluoride or the like. The precursor gases may be delivered to the first remote plasma source 126 individually or in combination and/or sequentially or concurrently.

In operation, materials may be outgassed from the thermally processed substrates and material may eventually deposit and build up on surfaces of the first chamber 102. In certain implementations, it may be desirable to remove the deposits and a suitable precursor gas may be selected to be delivered to the first remote plasma source 126 from the first gas source 128. The first remote plasma source 126 may generate a plasma and deliver the plasma/plasma products through the first conduit 130 to the first process volume 110. A first showerhead 762 may receive the plasma/plasma products and distribute the plasma/plasma products about the first process volume 110 to facilitate cleaning of the first process volume 110.

Materials outgassed from the thermally processed substrates and materials removed from the surfaces of the first chamber 102 via the plasma may be exhausted from the first process volume 110 by an exhaust conduit 114 to an exhaust 116. The exhaust 116 may be a pump, such as a turbopump, configured to generate a reduced pressure environment in the first process volume 110 and to remove gases and other materials from the first process volume 110.

The apparatus 100 also includes a second process chamber 104 which is substantially identical to the first process chamber 102. The second process chamber 104 defines a second process volume 112, has second sidewalls 124 and a second ceiling 122, and may have a second substrate support 108 disposed therein. The materials and configuration of the second process chamber 104 may be identical to or substantially similar to the materials and configuration of the first process chamber 102.

In one embodiment, the first process chamber 102 and the second process chamber 104 share a wall. In such an embodiment, the sidewall 120A of the first process chamber 102 and the sidewall 124A of the second process chamber 104 are joined, or are the same wall.

A second remote plasma source 132 may be coupled to and in fluid communication with the second process volume 112. The second remote plasma source 132 may be configured to generate a plasma remotely from the second process volume 112 and deliver plasma products to the second process volume 112. The plasma products may be delivered to the second process volume 112 via a second conduit 136 which is fluidly coupled to the second remote plasma source 132 and the second process volume 112. In one implementation, the second conduit 136 may extend from the second remote plasma source 132 to the second ceiling 122 of the second chamber 104. The second conduit 136 may be a conduit of any suitable shape and may be formed from a material which is predominantly inert to the plasma products generated by the second remote plasma source 132. In one implementation, the second conduit 136 may be formed from a quartz material, a ceramic material, or a metallic material. Surfaces of the second conduit 136 exposed to the plasma products may also be coated with various materials inert or substantially inert to the plasma products to reduce or prevent damage, etching, or deposition of the second conduit 136.

The second plasma source 132 may also be in fluid communication with a second gas source 134. The second gas source 134 delivers one or more precursor gases to the second remote plasma source 132. In one implementation, the first gas source 128 and the second gas source 134 are separate gas sources. In another implementation, the first gas source 128 and the second gas source 134 are the same gas source. In either implementation, the first and second gas sources 128, 134 may be configured to delivery any desired combination of precursor gases. In one implementation, the second gas source 134 may deliver precursor gases such as argon, oxygen, nitrogen, helium, and fluorine containing gases, such as nitrogen trifluoride or the like. The precursor gases may be delivered to the second remote plasma source 132 individually or in combination and/or sequentially or concurrently.

In operation, materials may be outgassed from the thermally processed substrates and material may eventually deposit and build up on surfaces of the second chamber 104. As previously described, it may be desirable to remove the deposits and a suitable precursor gas may be selected to be delivered to the second remote plasma source 132 from the second gas source 134. The second remote plasma source 132 may generate a plasma and deliver the plasma/plasma products through the second conduit 136 to the second process volume 112. A second showerhead 764 may receive the plasma/plasma products and distribute the plasma/plasma products about the second process volume 112 to facilitate cleaning of the second process volume 112.

The second process volume 112 is also connected to the exhaust 116 via the exhaust conduit 114. Thus, the first process volume 110 and the second process volume 112 are commonly pumped by the exhaust 116. It is contemplated that the exhaust 116 may generate a reduced pressure environment in the second process volume 112 similar or identical to the reduced pressure environment of the first process volume 110. Because the exhaust 116 is in fluid communication with the first process volume 110 and the second process volume 112, the exhaust conduit 114 couples both of the process volumes 110, 112 to the exhaust 116. The exhaust conduit 114 may be coupled to the first and second chambers 102, 104 through sidewalls 120, 124 or a bottom of the chambers 102, 104 which is disposed opposite the ceilings 118, 122.

Figure 2:
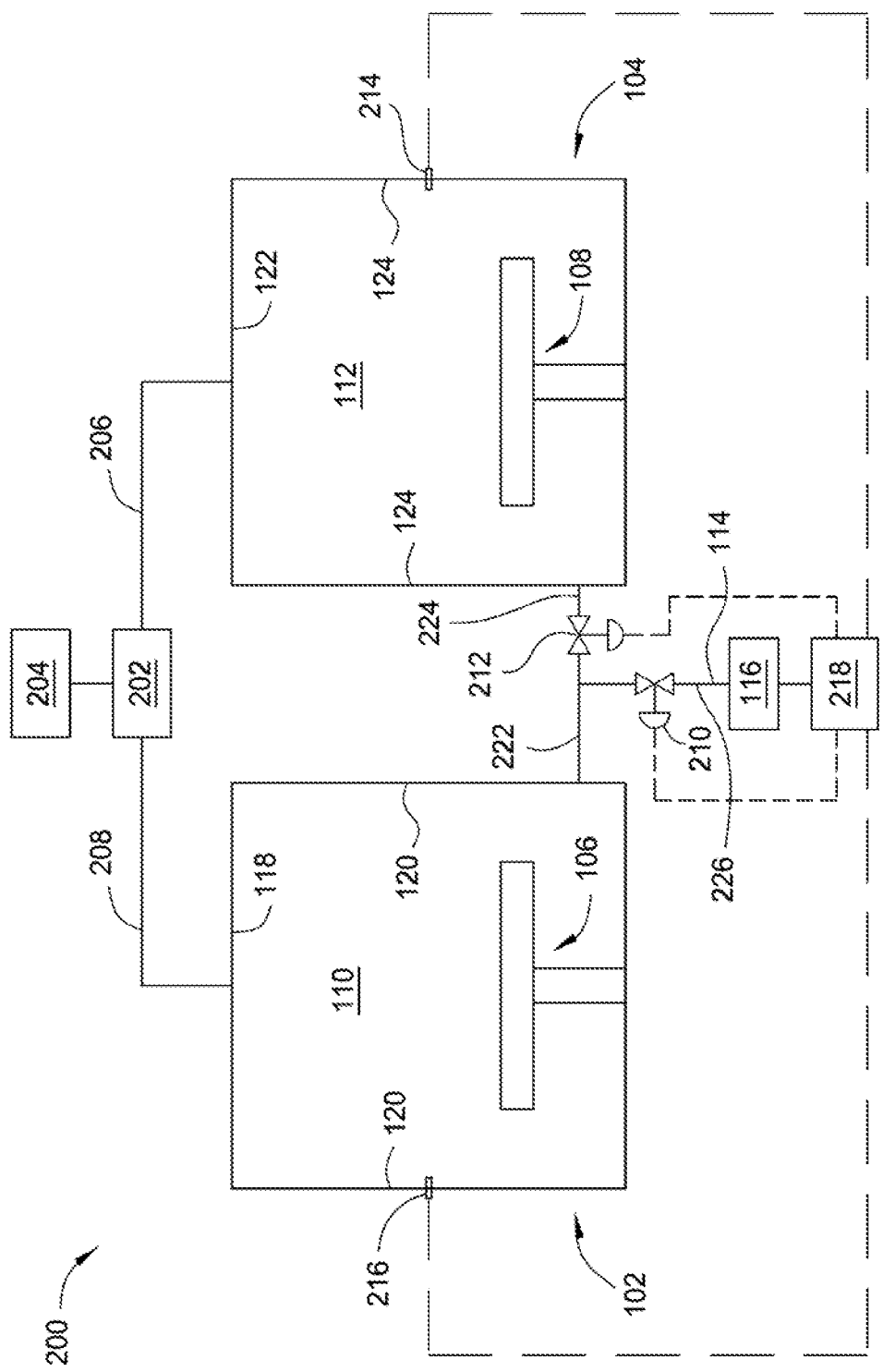
FIG. 2 schematically illustrates a dual chamber thermal processing apparatus having a remote plasma source according to another embodiment.

FIG. 2 schematically illustrates a dual chamber thermal processing apparatus 200 having a remote plasma source 202 according to one implementation described herein. In the illustrated implementation, the remote plasma source 202 is in fluid communication with the first process volume 110 and the second process volume 112. The remote plasma source 202 may be fluidly coupled to the first process volume 110 via a first conduit 208 and may also be fluidly coupled to the second process volume 112 via a second conduit 206. In one implementation, the first conduit 208 may extend from the remote plasma source 202 to the first ceiling 118 of the first chamber 102 and the second conduit 206 may extend from the remote plasma source 202 to the second ceiling 122 of the second chamber 104. A gas source 204 may be in fluid communication with the remote plasma source 202 and deliver various precursors to the remote plasma source 202. The gas source 204 may be a single gas source or may be configured to provide a plurality of different gases.

The remote plasma source 202 may generate an amount of plasma/plasma products suitable to supply the first and second process volumes 110, 112. In one implementation, a single precursor may be delivered to the remote plasma source 202 from the gas source 204 and a plasma may be subsequently generated and delivered to the process volumes 110, 112. In another implementation, multiple precursors may be delivered at the same time to the remote plasma source 202 from the gas source and a plasma of the precursors may be generated and delivered to the process volumes 110, 112.

In yet another implementation, a first precursor may be delivered to the remote plasma source 202 and the resulting plasma may be delivered to the process volumes 110, 112. Subsequently, a second precursor different from the first precursor may be delivered to the remote plasma source 202 from the gas source 204 and the resulting plasma may be sequentially delivered to the process volumes 110, 112. It is contemplated that any combination of precursors in any order (i.e. sequentially, concurrently) may be delivered to the remote plasma source 202 from the gas source 204. The plasma and plasma products generated by the remote plasma source 202 may be delivered to the process volumes 110, 112 continuously or in a pulsed manner.

The remote plasma source 202 may be similar to the first plasma source 126 or the second plasma source 132 described with regard to FIG. 1. Similarly, the first conduit 208 and the second conduit 206 may be formed from the same or similar materials to the first 130 or second conduit 136. In operation, the first chamber 102 and the second chamber 104 may thermally process substrates. After thermal processing is performed, the remote plasma source 202 generates a cleaning plasma and delivers the plasma and plasma products to the process volumes 110, 112 of each of the first chamber 102 and the second chamber 104. The plasma products and other effluent may then be evacuated from the process volumes 110, 112 via the exhaust 116.

The embodiment of FIG. 2 includes optional apparatus for maintaining and controlling a difference in pressure between the first chamber 102 and the second chamber 104. A first branch 222 of the exhaust conduit 114 connects to the first chamber 102, and a second branch 224 of the exhaust conduit 114 connects to the second chamber 104. The first branch 222 fluidly couples the first chamber 102 to the exhaust 116, and the second branch 224 fluidly couples the second chamber 104 to the exhaust 116. The first and second branches 222 and 224 join in a common branch 226 of the exhaust conduit 114. A chamber exhaust flow controller 212 may be disposed in either the first branch 222 or the second branch 224 (shown disposed in the second branch 224 in FIG. 2) to control effluent flow rate from the respective chamber (in this case the second chamber 104). A system exhaust flow controller 210 may be disposed in the common branch 226 of the exhaust conduit 114 to control overall system exhaust flowrate. The flow controllers 210 and 212 also function to control pressure in the first and second chambers 102 and 104. By independently controlling the overall system effluent flowrate as well as a single chamber effluent flowrate, the pressures in the first and second chambers 102 and 104 can be controlled independently, and can therefore be matched, if desired. Such control may be facilitated by use of an optional first pressure sensor 216 disposed in the first chamber 102 and an optional second pressure sensor 214 disposed in the second chamber 104. An optional controller 218 monitors signals from the first and second pressure sensors 216 and 214, and can manipulate the flow controllers 210 and 212 to achieve a desired pressure delta, including zero, between the first and second chambers 102 and 104.

Figure 3:
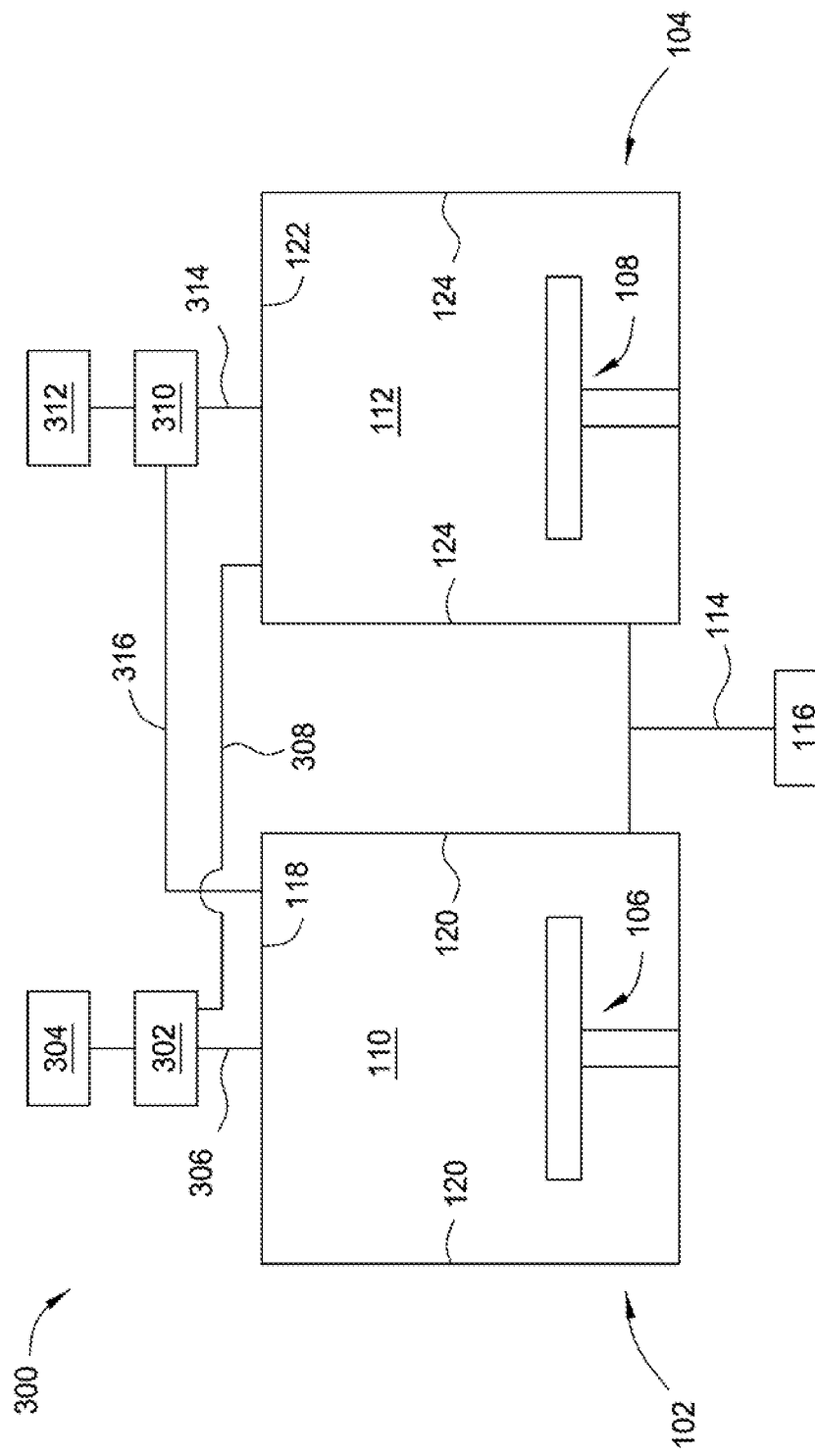
FIG. 3 schematically illustrates a dual chamber thermal processing apparatus having remote plasma sources according to another embodiment.

FIG. 3 schematically illustrates a dual chamber thermal processing apparatus 300 having remote plasma sources 302, 310 according to one implementation described herein. In the illustrated embodiment, a first plasma source 302 may be in fluid communication with the first chamber 102 via a first conduit 306 and the second chamber 104 via a second conduit 308. In one implementation, the first conduit 306 may extend from the first remote plasma source 302 and the first ceiling of the first chamber 102 and the second conduit 308 may extend from the first remote plasma source 302 and the second ceiling 122 of the second chamber 104. The first remote plasma source 302 is also in fluid communication with a first gas source 304.

A second remote plasma source 310 may be in fluid communication with the second chamber 104 via a third conduit 314 and the first chamber 102 via a fourth conduit 316. In one implementation, the third conduit 314 may extend from the second remote plasma source 310 to the second ceiling of the second chamber 104 and the fourth conduit 316 may extend from the second remote plasma source 310 to the first ceiling 118 of the first chamber 102. A second gas source 312 is in fluid communication with the second remote plasma source 310. The second gas source 312 may be configured to deliver any of the precursors previously described to the second remote plasma source 310. The second remote plasma source 310 may generate a plasma and deliver the plasma products to both the second chamber 104 and the first chamber 102.

Similarly, the first gas source 304 may be configured to deliver any of the precursors previously described to the first remote plasma source 302. The first remote plasma source 302 may generate a plasma and deliver the plasma products to both the first chamber 102 and the second chamber 104. The first and second remote plasma sources 302, 310 may generate any type or combination of cleaning plasma and deliver the plasma products in any desirable manner, such as a pulsed delivery, an alternating plasma type delivery, or a continuous delivery of one or more plasma types. In one implementation, the first remote plasma source 302 may generate a first plasma type and deliver the plasma products to the chambers 102, 104. The second remote plasma source 310 may generate a second plasma type different from the first plasma type and deliver the plasma products to the chambers 102, 104.

Figure 4:
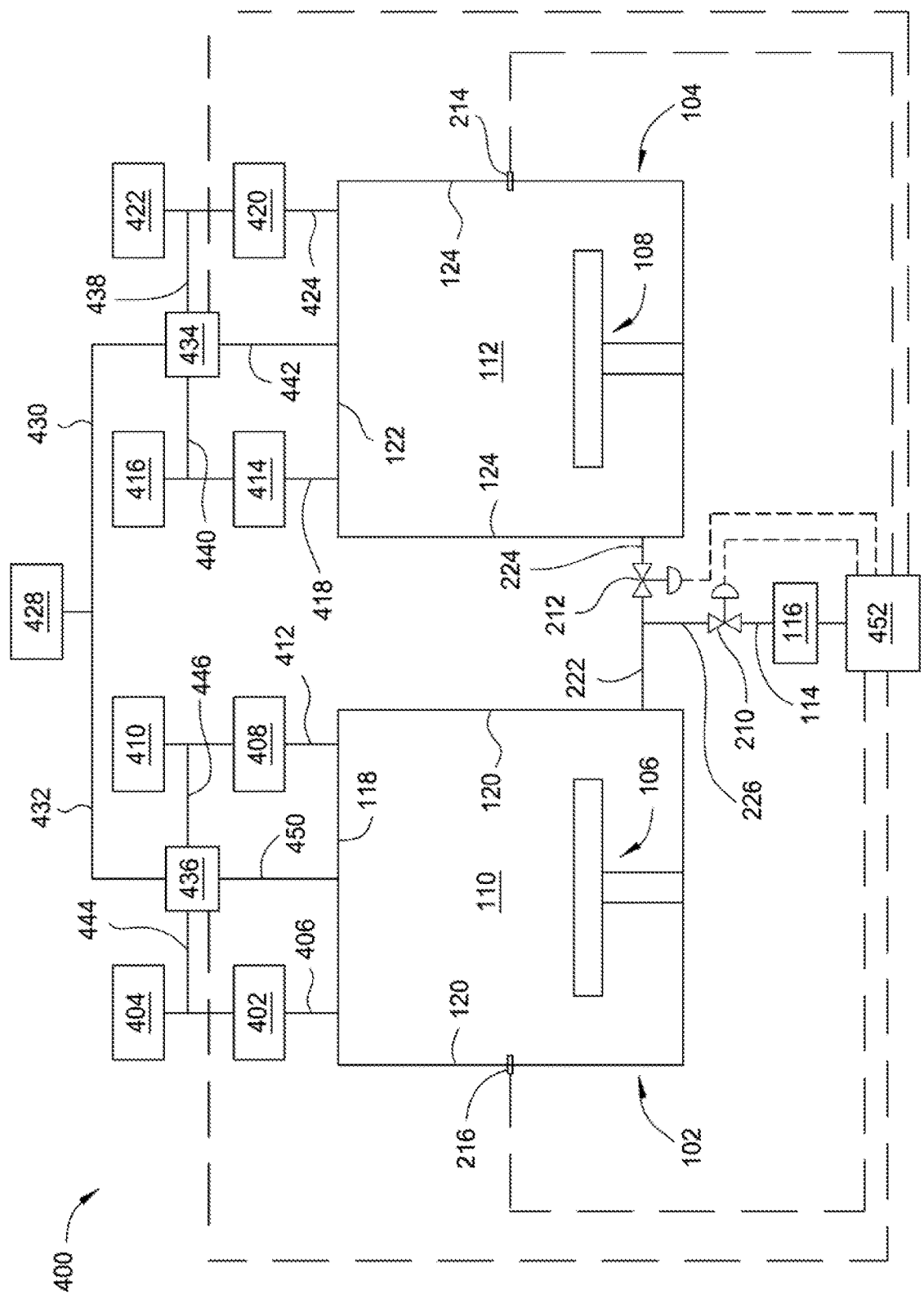
FIG. 4 schematically illustrates a dual chamber thermal processing apparatus having remote plasma sources according to another embodiment.

FIG. 4 schematically illustrates a dual chamber thermal processing apparatus 400 having remote plasma sources 402, 408, 414, 420 according to one implementation described herein. In the illustrated implementation, a first remote plasma source 402 may be in fluid communication with the first process volume 110 of the first chamber 102 via a first conduit 406. In one implementation, the first conduit 406 may extend from the remote plasma source 402 to the first ceiling 118 of the first chamber 102. The first remote plasma source 402 is also in fluid communication with a first gas source 404. A second remote plasma source 408 may also be in fluid communication with the first process volume 110 of the first chamber 102 via a second conduit 412. In one implementation, the second conduit 412 may extend from the second remote plasma source 408 to the first ceiling 118 of the first chamber 102. The second remote plasma source 408 is also in fluid communication with a second gas source 410.

The gas sources 404, 410 may provide any of the previously described precursors in any combination to the remote plasma sources 402, 408. In one implementation, the first gas source 404 may provide a first precursor to the first remote plasma source 402 and a first plasma may be generated and delivered to the first process volume 110. The second gas source 410 may provide a second precursor different from the first precursor to the second remote plasma source 408 and a second plasma may be generated and delivered to the first process volume 110.

For example, the first gas source 404 may deliver argon, helium, or a combination thereof to the first remote plasma source 402. The first remote plasma source 402 may generate a first plasma remotely from the first process volume 110 and deliver the plasma products (i.e. radicals and/or ions) to the first process volume 110 via the first conduit 406. The second gas source 410 may deliver oxygen, $NF_3$, or a combination thereof to the second remote plasma source 408. The second remote plasma source 408 may generate a second plasma remotely from the first process volume 110 and deliver the plasma products to the first process volume 110 via the second conduit 412. The first and second plasma may be delivered to the first process volume 110 at the same time, in an alternating manner, or in any desired sequence configured to clean the first chamber 102 and articles disposed therein.

Similarly, a third remote plasma source 414 may be in fluid communication with the second process volume 112 of the second chamber 104 via a third conduit 418. In one implementation, the third conduit 418 may extend from the third remote plasma source 414 to the second ceiling 122 of the second chamber 104. The third remote plasma source 414 is also in fluid communication with a third gas source 416. In one implementation, the third gas source 416 may be similar to the first gas source 404. A fourth remote plasma source 420 may also be in fluid communication with the second process volume 112 of the second chamber 104 via a fourth conduit 424. In one implementation, the fourth conduit 424 may extend from the fourth remote plasma source 420 to the second ceiling 122 of the second chamber 104. The fourth remote plasma source 420 is also in fluid communication with a fourth gas source 422. In one implementation, the fourth gas source 422 may be similar to the second gas source 410. It is contemplated that the third and fourth remote plasma sources 414, 420 and third and fourth gas sources 416, 422 may be implemented and operated similarly to the first and second remote plasma sources 402, 408 and the first and second gas sources 404, 410.

FIG. 4 includes optional apparatus for controlling pressure and composition independently in the first and second chambers 102 and 104. The chamber and system flow controllers 212 and 210, and the pressure sensors 214 and 216, are shown. Additionally, a carrier gas source 428 is shown coupled to the first and second chambers 102 and 104 by respective conduits, first carrier gas conduit 432 and second carrier gas conduit 430. For each chamber, a flow controller, respectively a first carrier gas flow controller 436 and a second carrier gas flow controller 434, each of which may be a three-way valve, directs carrier gas to join with gases from the gas sources 404, 410, 416, and 422 flowing to the remote plasma sources 402, 408, 414, and 420, through respective conduits 444, 446, 440, and 438, or directly to the chambers 102 and 104 through respective conduits 450 and 442. The flow controllers 434 and 436, along with the pressure control apparatus, are coupled to, and controlled by, the controller 452, which uses the flow controllers 210 and 212 to control the pressure in each of the first and second chambers 102 and 104, and the three way flow controllers 436 and 434 to control the flow of gases into the first and second chambers 102 and 104.

Figure 5:
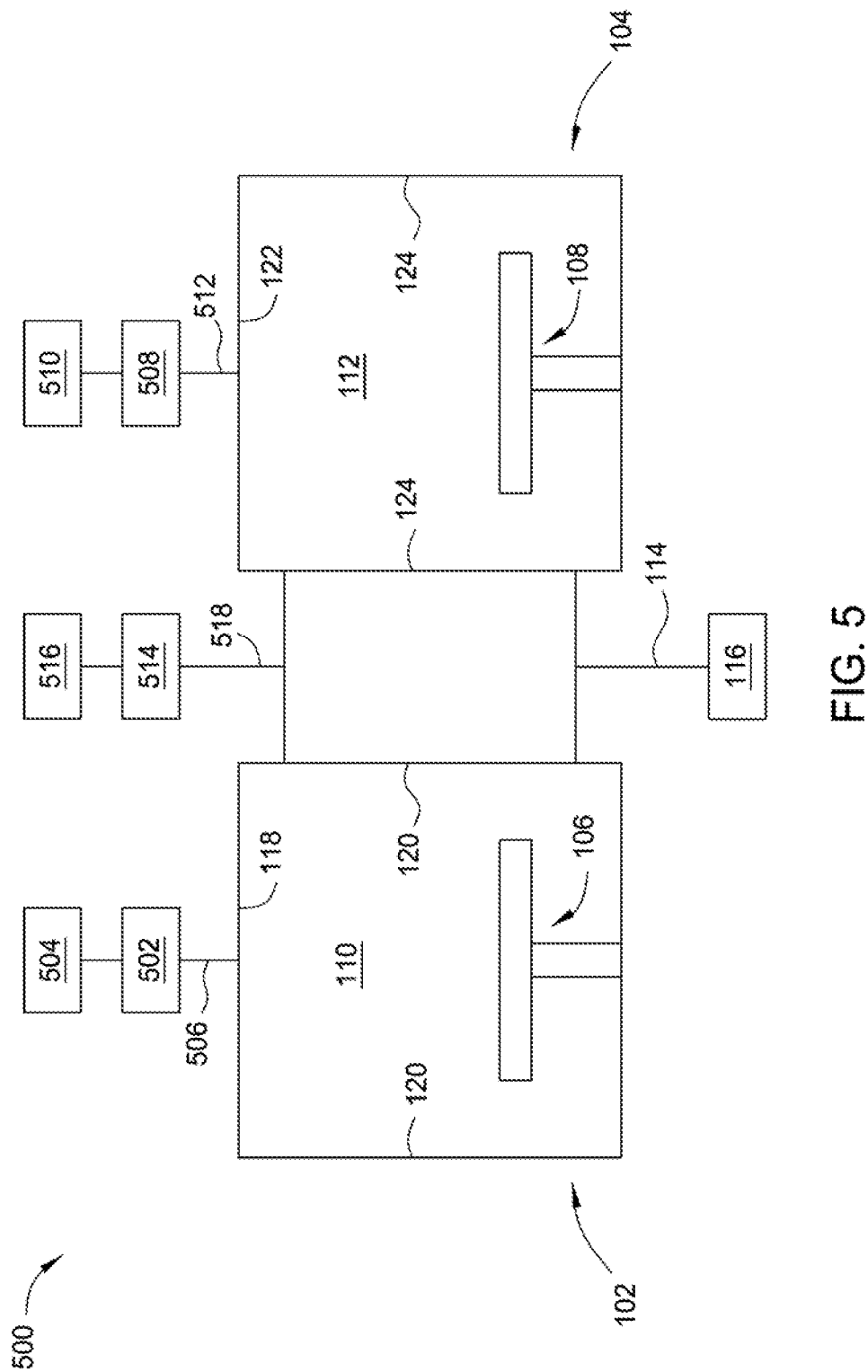
FIG. 5 schematically illustrates a dual chamber thermal processing apparatus having remote plasma sources according to another embodiment.

FIG. 5 schematically illustrates a dual chamber thermal processing apparatus 500 having remote plasma sources 502, 508, 514 according to one implementation described herein. In the illustrated implementation, a first remote plasma source 502 may be in fluid communication with the first process volume 110 of the first chamber 102 via a first conduit 506. In one implementation, the first conduit 506 may extend from the first plasma source 502 and the first ceiling 118 of the first chamber 102. A first gas source 504 is also in fluid communication with the first remote plasma source 502. The first gas source 504 may deliver a first precursor type to the first remote plasma source 502 and the first remote plasma source 502 may generate and deliver plasma products to the first process volume 110.

Similarly, a second remote plasma source 508 may be in fluid communication with the second process volume 112 of the second chamber 104 via a second conduit 512. In one implementation, the second conduit 512 may extend from the second plasma source 508 and the second ceiling 122 of the second chamber 104. A second gas source 510 is also in fluid communication with the second remote plasma source 508. The second gas source 510 may deliver a second precursor type to the second remote plasma source 508 and the second remote plasma source 508 may generate and deliver plasma products to the second process volume 112. In one implementation, the second precursor type may be the same as the first precursor type. In another implementation, the second precursor type may be different than the first precursor type.

A third remote plasma source 514 is in fluid communication with the first process volume 110 and the second process volume 112 of the first and second chambers 102, 104, respectively, via a third conduit 518. Thus, the third conduit 518 fluidly couples the first process volume 110 and the second process volume 112 to the third remote plasma source 514. In the illustrated implementation, the third conduit 518 extends between the third remote plasma source 514 and the first sidewall 120 of the first chamber 102 and the second sidewall 124 of the second chamber 104. The position where the third conduit 518 couples to the sidewalls 120, 124 may be in a plane above a plane (i.e. closer to the first ceiling 118) occupied by a slit valve (not shown). In another implementation, the third conduit 518 may extend between the third remote plasma source 514 and the first ceiling 118 and the second ceiling 122 of the first and second chambers 102, 104, respectively.

A third gas source 516 may also be in fluid communication with the third remote plasma source 514. The third gas source 516 may deliver any desirable precursor type to the third remote plasma source 514. In one implementation, the third gas source 516 may deliver a third precursor type similar to the first and second precursor types provided by the first and second gas sources 504, 510. In another implementation, the third gas source 516 may deliver the third precursor type which is different from the first and second precursor types.

Injecting remote plasma into the sidewalls 120 and 124 of the process chambers 102 and 104 enables delivering gases from the remote plasma source 514 below the substrate supports 106 and 108, respectively. If the remote plasma source 514 is delivering cleaning gases, and the substrate supports 106 and 108 are actuated in an axial direction, the substrate supports 106 and 108 may be extended such that the supporting area of the substrate support is above the inlet for gases from the remote plasma unit 514, exposing lower regions of the process chambers 102 and 104 to cleaning gases. In this way, one or both of the process chambers 102 and 104 may be subjected to cleaning in the lower areas of the chambers.

Figure 6:
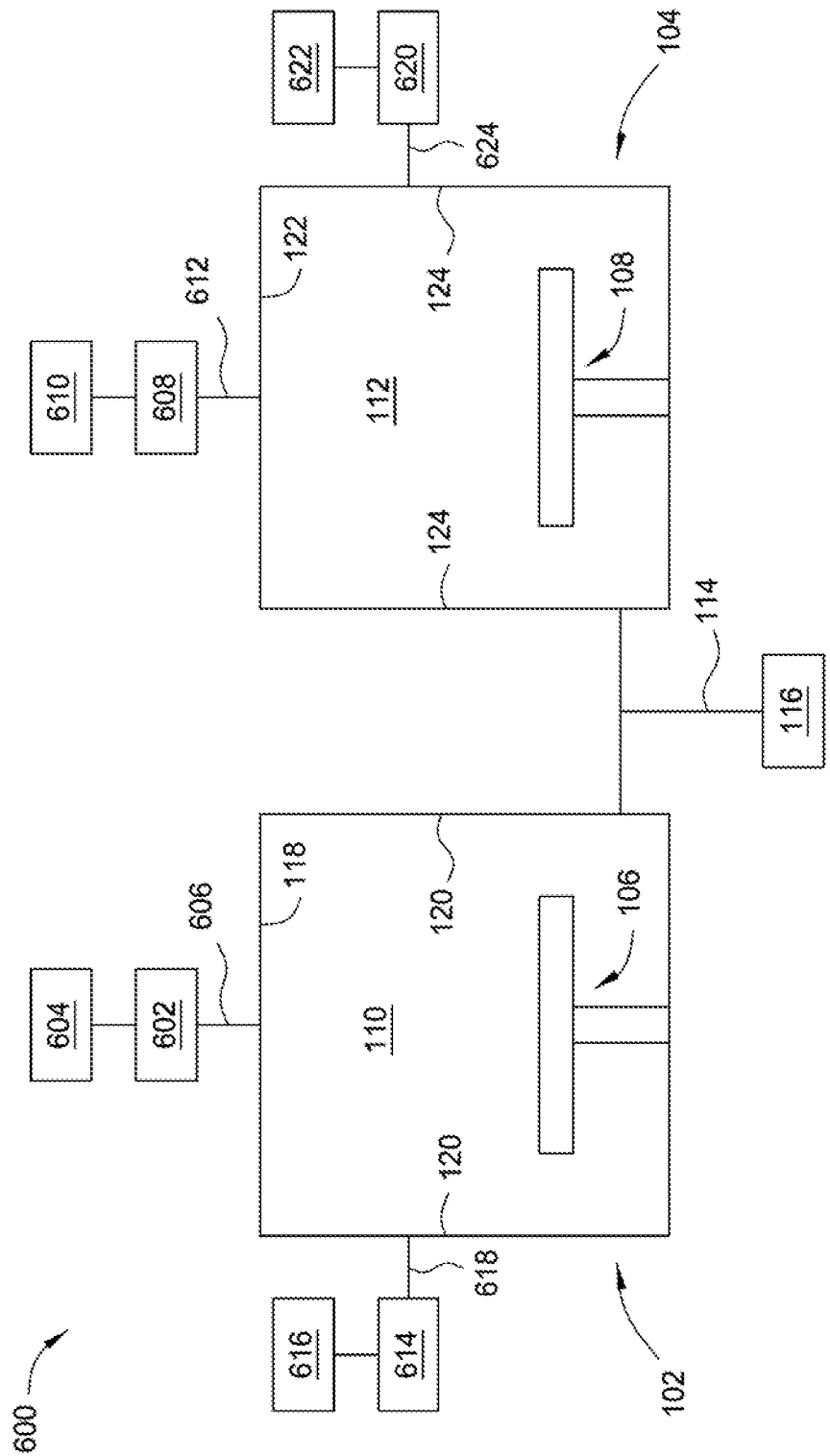
FIG. 6 schematically illustrates a dual chamber thermal processing apparatus having remote plasma sources according to another embodiment.

FIG. 6 schematically illustrates a dual chamber thermal processing apparatus 600 having remote plasma sources 602, 608, 614, 620 according to one implementation described herein. In the illustrated implementation, a first remote plasma source 602 may be in fluid communication with the first process volume 110 of the first chamber 102 via a first conduit 606. In one implementation, the first conduit 606 may extend from the first plasma source 602 and the first ceiling 118 of the first chamber 102. A first gas source 604 is also in fluid communication with the first remote plasma source 602. The first gas source 604 may deliver a first precursor type to the first remote plasma source 602 and the first remote plasma source 602 may generate and deliver plasma products to the first process volume 110.

Similarly, a second remote plasma source 608 may be in fluid communication with the second process volume 112 of the second chamber 104 via a second conduit 612. In one implementation, the second conduit 612 may extend from the second remote plasma source 608 and the second ceiling 122 of the second chamber 104. A second gas source 610 is also in fluid communication with the second remote plasma source 608. The second gas source 610 may deliver a second precursor type to the second remote plasma source 608 and the second remote plasma source 608 may generate and deliver plasma products to the second process volume 112. In one implementation, the second precursor type may be the same as the first precursor type. In another implementation, the second precursor type may be different than the first precursor type.

A third remote plasma source 614 is in fluid communication with the first process volume 110 via a third conduit 618. In the illustrated implementation, the third conduit 618 extends between the third remote plasma source 614 and the first sidewall 120 of the first chamber 102. The position where the third conduit 618 couples to the first sidewall 120 may be in a plane above a plane (i.e. closer to the first ceiling 118) occupied by a slit valve (not shown).

A third gas source 616 may also be in fluid communication with the third remote plasma source 614. The third gas source 616 may deliver any desirable precursor type to the third remote plasma source 614. In one implementation, the third gas source 616 may deliver a third precursor type similar to the first and second precursor types provided by the first and second gas sources 604, 610. In another implementation, the third gas source 616 may deliver the third precursor type which is different from the first and second precursor types.

A fourth remote plasma source 620 is in fluid communication with the second process volume 112 via a fourth conduit 624. In the illustrated implementation, the fourth conduit 624 extends between the fourth remote plasma source 620 and the second sidewall 124 of the second chamber 104. The position where the fourth conduit 624 couples to the second sidewall 124 may be in a plane above a plane (i.e. closer to the second ceiling 122) occupied by a slit valve (not shown).

A fourth gas source 622 may also be in fluid communication with the fourth remote plasma source 620. The fourth gas source 622 may deliver any desirable precursor type to the fourth remote plasma source 620. In one implementation, the fourth gas source 622 may deliver a fourth precursor type similar to the first, second, and third precursor types provided by the first, second, and third gas sources 604, 610, 616. In another implementation, the fourth gas source 622 may deliver the fourth precursor type which is different from the first, second, and third precursor types. In one implementation, the first and second gas sources 604, 610 may deliver a first precursor type and the third and fourth gas sources 616, 622 may deliver a second precursor type different from the first precursor type.

Figure 7:
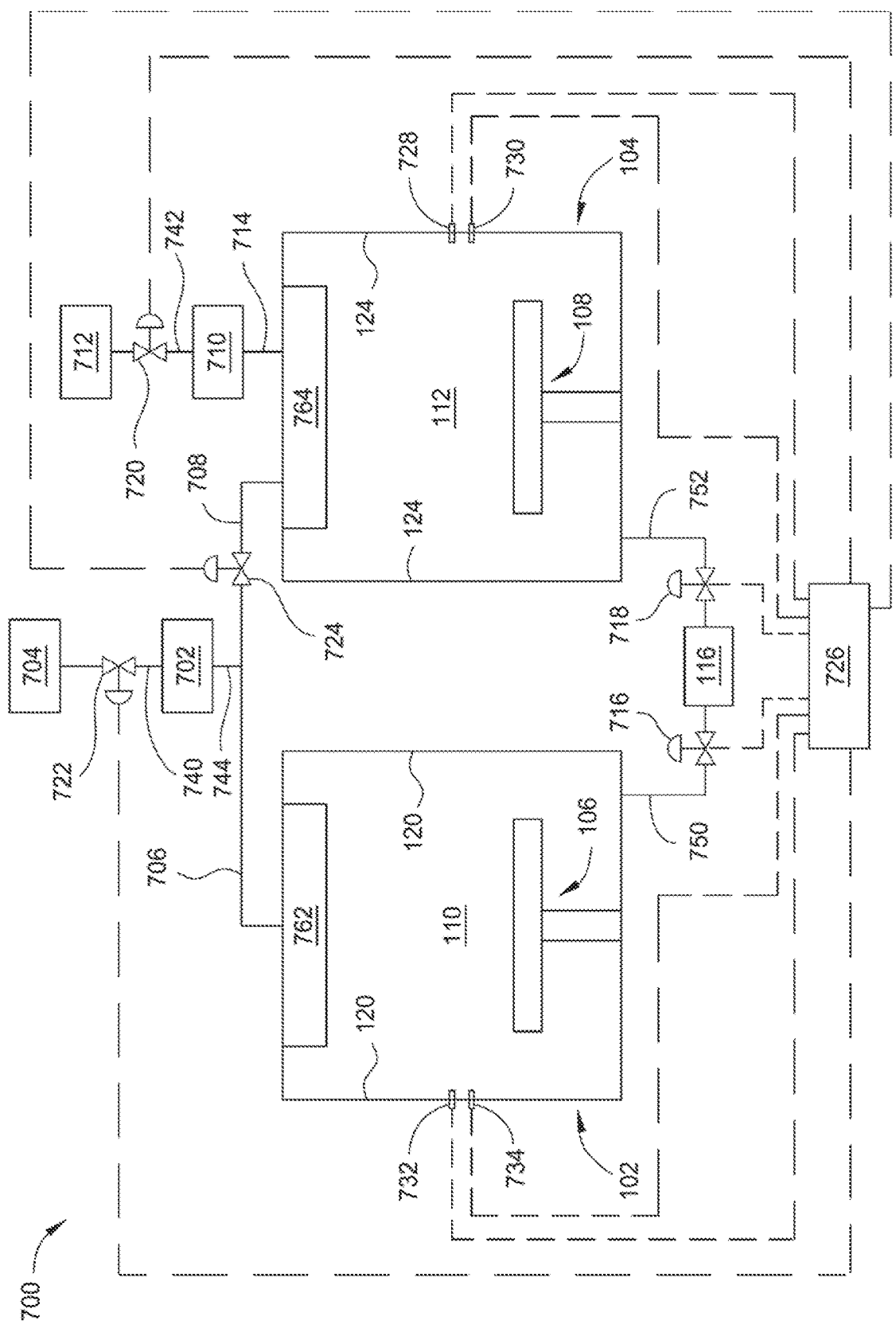
FIG. 7 schematically illustrates a dual chamber thermal processing apparatus according to another embodiment.

FIG. 7 schematically illustrates a dual chamber thermal processing apparatus 700 according to another embodiment. The apparatus 700 is similar in many respects to the other apparatus described herein. In the embodiment of FIG. 7, each of the first and second chambers 102 and 104 has a dedicated exhaust conduit, first exhaust conduit 750 and second exhaust conduit 752 respectively, fluidly coupling the respective interior volumes 110 and 112 to the exhaust 116. Each exhaust conduit 750 and 752 has a respective flow controller, first exhaust flow controller 716 and second exhaust flow controller 718 respectively, that can be used to control pressure in respective first and second chambers 102 and 104. A pressure sensor in each of the first and second chambers 102 and 104, first pressure sensor 732 and second pressure sensor 728 respectively, sends a pressure signal to a controller 726, which controls the flow controllers 716 and 718 to maintain pressure in the respective chambers 102 and 104.

The apparatus 700 is a dual chamber thermal processing apparatus with a first remote plasma source 702 in fluid communication with the first process volume 110 and the second process volume 112. The first remote plasma source 702 may be fluidly coupled to the first process volume 110 via a first plasma conduit 706 and may also be fluidly coupled to the second process volume 112 via a second plasma conduit 708. A third plasma conduit 744 connects both conduits 706 and 708 to the first remote plasma source 702. A plasma flow controller 724 may be disposed in one of the conduits 706 and 708 (shown in FIG. 7 disposed in the second conduit 708) to control how much flow from the first remote plasma source 702 goes to each of the first and second chambers 102 and 104.

A gas source 704 may be in fluid communication with the first remote plasma source 702 and deliver various precursors to the first remote plasma source 702 through a first gas source conduit 740. The gas source 704 may be a single gas source or may be configured to provide a plurality of different gases. A first source flow controller 722 may be disposed in the first source conduit 740 to control the total flow of gas from the gas source 704 to both the first and second chambers 102 and 104. Thus, the flow controllers 722 and 724 independently control flow from the first remote plasma source 702 to the first and second chambers 102 and 104, respectively.

A second remote plasma source 710 is coupled to the second process chamber 104 by a fourth plasma conduit 714. A second gas source 712 may be coupled to the second remote plasma source 710 by a second source conduit 742 to deliver process gases to the second remote plasma source 710. A second source flow controller 720 may be disposed in the second source conduit 742 to control gas flow to the second process chamber 104 through the fourth plasma conduit 714. In this way flow of remote plasma from both the first gas source 704 and the second gas source 712 to the second chamber 104 may be independently controlled.

The first chamber 102 may be provided with a first composition sensor 734, and the second chamber 104 may be provided with a second composition sensor 730, to signal the composition of respective processing volumes 110 and 112. The sensors may be spectral or chemical. The controller 726 may receive composition signals from the composition sensors 734 and 730, and may manipulate the flow controllers 720, 722, and 724 to control composition of the processing volumes 110 and 112 independently. In this way, the apparatus of FIG. 7 features independent composition and pressure control of the two chambers 102 and 104.

Implementations described herein provide for an improved thermal processing chamber with integrated plasma cleaning capabilities and the associated apparatus suitable to perform such processes. Thus in-situ plasma cleaning of a non-plasma processing thermal chamber may be achieved. The various implementations may be utilized in combination with one another and certain aspects from certain implementations may be combined with certain implementations from other implementations, all of which are implementations contemplated in the instant disclosure.

While the foregoing is directed to implementations of the present disclosure, other and further implementations of the disclosure may be devised without departing from the basic scope thereof, and the scope thereof is determined by the claims that follow.

What is claimed is:

1. A substrate processing apparatus, comprising:
a first process chamber defining a first process volume;
a second process chamber defining a second process volume;
a first remote plasma source coupled to the first process chamber by a first plasma conduit configured to deliver a plasma from the first remote plasma source to a first showerhead disposed in the first process volume;
a second plasma conduit coupled between the first remote plasma source and the second process chamber, the second plasma conduit configured to deliver the plasma from the first remote plasma source to a second showerhead disposed in the second process volume;
a second remote plasma source coupled to the second process chamber by a third plasma conduit;
an exhaust coupled to the first process chamber by a first exhaust conduit and to the second process chamber by a second exhaust conduit;
a common exhaust conduit coupling the first exhaust conduit and the second exhaust conduit to the exhaust;
a total exhaust flow controller disposed in the common exhaust conduit; and
a chamber exhaust flow controller disposed in the first exhaust conduit.

2. The apparatus of claim 1, further comprising a first plasma flow controller disposed in the first plasma conduit, a second plasma flow controller disposed in the second plasma conduit, and a controller coupled to the first and second plasma flow controllers, the total exhaust flow controller, and the chamber exhaust flow controller.

3. The apparatus of claim 1, further comprising a first pressure sensor disposed in the first process chamber and a second pressure sensor disposed in the second process chamber.

4. The apparatus of claim 3, further comprising a controller coupled to the first and second pressure sensors, the total exhaust flow controller, and the chamber exhaust flow controller.

5. The apparatus of claim 4, further comprising:
a first composition sensor disposed in the first process chamber and a second composition sensor disposed in the second process chamber, wherein a first gas source is coupled to the first remote plasma source by a first source conduit;
a second gas source is coupled to the second remote plasma source by a second source conduit;
a first source flow controller is disposed in the first source conduit; and
a second source flow controller is disposed in the second source conduit.

6. The apparatus of claim 5, wherein the controller is also coupled to the first source flow controller, the second source flow controller, the first composition sensor, and the second composition sensor.

7. A substrate processing apparatus, comprising:
a first process chamber defining a first process volume;
a second process chamber defining a second process volume;
a first remote plasma source coupled to the first process chamber by a first plasma conduit configured to deliver a plasma from the first remote plasma source to a first showerhead disposed in the first process volume;
a second plasma conduit coupled between the first remote plasma source and the second process chamber, the second plasma conduit configured to deliver the plasma from the first remote plasma source to a second showerhead disposed in the second process volume;
a second remote plasma source coupled to the second process chamber by a third plasma conduit configured to deliver a plasma from the second remote plasma source to the second showerhead;

a carrier gas source coupled to the first process chamber by a first carrier gas conduit and to the second process chamber by a second carrier gas conduit;

an exhaust coupled to the first process chamber by a first exhaust conduit and to the second process chamber by a second exhaust conduit;

a common exhaust conduit coupling the first exhaust conduit and the second exhaust conduit to the exhaust;

a total exhaust flow controller disposed in the common exhaust conduit;

a chamber exhaust flow controller disposed in the first exhaust conduit;

a first pressure sensor disposed in the first process chamber; and a second pressure sensor disposed in the second process chamber.

8. The apparatus of claim 7, further comprising a plasma flow controller disposed in the second plasma conduit.

9. The apparatus of claim 8, further comprising a first gas source coupled to the first remote plasma source by a first source conduit, and a second gas source coupled to the second remote plasma source by a second source conduit, wherein the carrier gas source is also coupled to the first source conduit and the second source conduit.

10. The apparatus of claim 9, wherein the carrier gas source is coupled to the first source conduit by a first carrier gas flow controller and the carrier gas source is coupled to the second source conduit by a second carrier gas flow controller.

11. The apparatus of claim 10, further comprising:

a third remote plasma source coupled to the first process chamber;

a fourth remote plasma source coupled to the second process chamber;

a third gas source coupled to the third remote plasma source by a third source conduit; and a fourth gas source coupled to the fourth remote plasma source by a fourth source conduit, wherein the carrier gas source is also coupled to the third source conduit by the first carrier gas flow controller and the carrier gas source is also coupled to the fourth source conduit by the second carrier gas flow controller.

12. The apparatus of claim 11, further comprising:

a controller coupled to the total exhaust flow controller, the chamber exhaust flow controller, the first pressure sensor, the second pressure sensor, the plasma flow controller, the first carrier gas flow controller, and the second carrier gas flow controller, wherein the first carrier gas flow controller is a three-way valve and the second carrier gas flow controller is a three-way valve.

* * * * *